United States Patent [19]

Harada

[11] 3,944,816
[45] Mar. 16, 1976

[54] CHARGE TRANSFER APPARATUS HAVING LIGHT SENSITIVITY CONTROL MEANS

[75] Inventor: Nozomu Harada, Yokohama, Japan

[73] Assignee: Tokyo Shibaura Electric Co., Ltd., Kawasaki, Japan

[22] Filed: Oct. 2, 1974

[21] Appl. No.: 511,266

[30] Foreign Application Priority Data
Oct. 3, 1973 Japan.............................. 48-110477

[52] U.S. Cl................................ 250/211 J; 357/24
[51] Int. Cl.² ........................................ H01J 39/12
[58] Field of Search........ 250/211 R, 211 J; 357/24; 178/6.8, 7.1

[56] References Cited
UNITED STATES PATENTS

| | | | |
|---|---|---|---|
| 3,623,132 | 11/1971 | Green .................................. | 357/24 |
| 3,819,954 | 6/1974 | Butler et al. ......................... | 357/24 |
| 3,819,958 | 6/1974 | Gosney ............................... | 250/211 J |

Primary Examiner—Archie R. Borchelt
Assistant Examiner—D. C. Nelms
Attorney, Agent, or Firm—Cushman, Darby & Cushman

[57] ABSTRACT

A charge transfer apparatus having light sensitivity control means comprises a charge transfer device wherein a plurality of electrodes are provided on a semiconductor substrate in a manner insulated therefrom, means for supplying a driving pulse waveform of a constant period covering an integration period and a transfer-readout period to each of said electrodes of charge transfer device, detecting means for detecting the amount of light incident into the charge transfer device or the output signal level from the charge transfer device, and control means for controlling the width of an integration pulse within said integration period in accordance with the signal detected by the detecting means.

3 Claims, 18 Drawing Figures

CHARGE TRANSFER APPARATUS HAVING LIGHT SENSITIVITY CONTROL MEANS

This invention relates to a charge transfer apparatus constituting an image pickup apparatus, and more particularly to a charge transfer apparatus whose light sensitivity is controlled in accordance with the brightness of a foreground subject at the time of performing the image pickup.

The charge transfer device includes a "Charge Coupled Device" (which is hereinafter abbreviated to "CCD") or "Bucket Brigade Device" (which is hereinafter abbreviated to "BBD"). The "CCD" has been proposed by W. B. Bayle et al in the treatises "Charge Coupled Semiconductor Device" and "Experimental Verification of the Charge Coupled Device Concept" appearing on pages 587 to 600 of the "The Bell System Technical Journal" issued Apr. 19, 1970.

The "CCD" is constituted such that a plurality of electrodes are provided on a thin insulating film provided on a semiconductor substrate for applying an integration voltage to the integration electrodes during an integration period to cause potential wells to be produced in the semiconductor substrate and information carriers produced therein due to an incident optical image to be integrated in the potential wells and applying a transfer pulse to all of the electrodes including the integration electrodes during the succeeding transfer period to cause the information carriers to be transferred in a prescribed direction and sequentially reading out the information carriers as video signals from the output terminal of the end portion of the transfer device. That is, the "CCD" comprises integration means for integrating the information carriers, transfer means for transferring the information carriers and readout means for reading out the information carriers thus transferred.

Figure 1:
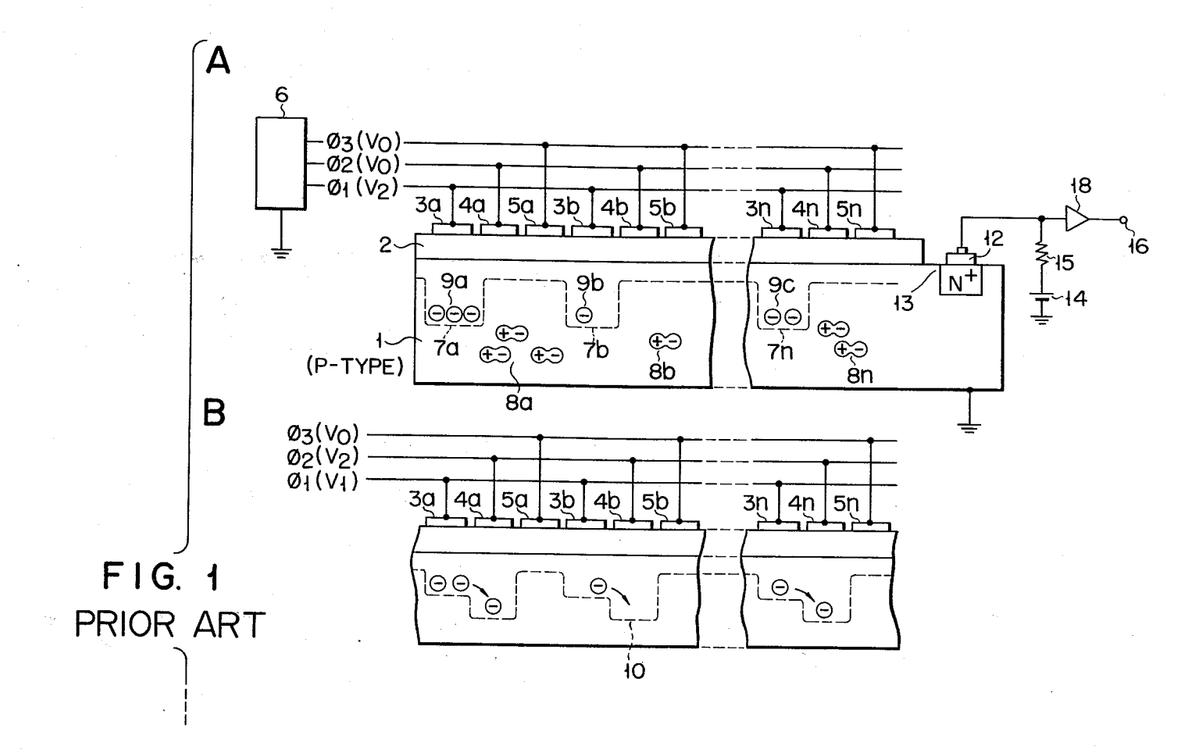
Figure 2:
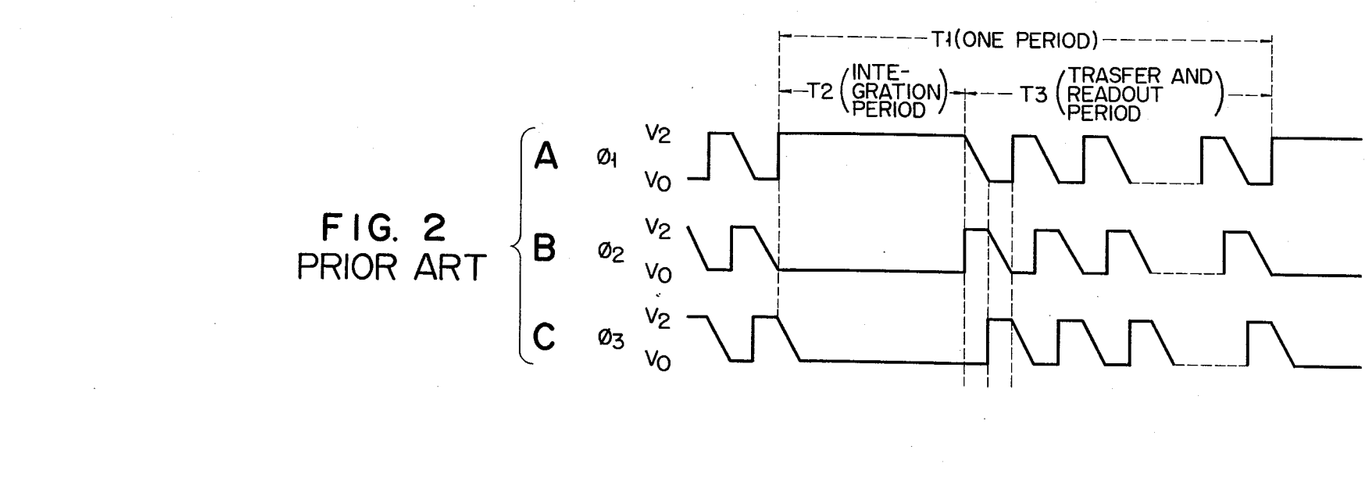

For convenience of explanation, the fundamental construction and the operation principle of a prior art CCD will hereinafter be described by reference to FIG. 1 and FIG. 2. FIG. 1 shows the construction of the charge coupled device of an N channel type −3 phase driving system. As shown in FIG. 1-A, an insulating film 2 is provided on a P type semiconductor substrate 1. On the insulating film 2 are arranged a plurality of electrodes $3a, 4a, 5a, 3b, 4b, 5b \ldots 3n, 4n$ and $5n$ in the order mentioned. Electrode conductors $\phi_1, \phi_2$ and $\phi_3$ are connected to the electrodes $(3a, 3b \ldots 3n)$, $(4a, 4b \ldots 4n)$ and $(5a, 5b \ldots 5n)$, respectively, that is, respectively connected to every third electrodes starting with the electrodes $3a, 4a$ and $5a$, respectively. Each electrode conductor is supplied with a voltage having such a waveform as is illustrated in FIG. 2 from a driving voltage source 6. The maximum level $V_2$ and the minimum level $V_0$ of each voltage waveform are both positive and bear the relationship of $V_0 < V_2$. $T_1, T_2$ and $T_3$ represent one frame period (or one field period), integration period and transfer and readout period, respectively. In the integration period $T_2$, when the electrodes $3a, 3b \ldots 3n$ are used as the integration electrodes, a driving pulse of FIG. 2-A is applied to the integration electrodes $3a, 3b \ldots 3n$. In the integration period $T_2$, when a voltage $V_2$ is applied to the electrode conductor $\phi_1$ and a voltage $V_0$ to the remaining electrode conductors $\phi_2$ and $\phi_3$, potential wells $7a, 7b \ldots 7n$ are produced in the semiconductor substrate below the integration electrodes $3a, 3b \ldots 3n$ (see FIG. 1-A).

When, under this condition, the optical image of a foreground subject (not shown) is focussed on the semiconductor substrate 1, electron-hole pairs $8a, 8b \ldots 8n$ corresponding to the brightness of the optical image are produced in the substrate 1. The minority carriers of the electron-hole pairs, namely, electrons $9a, 9b \ldots 9n$ are shifted by diffusion to the potential wells in the proximity of the electron-hole pairs and are integrated therein.

In the transfer readout periods $T_3$ immediately succeeding the completion of said integration, a transfer pulse is applied to all of the electrodes including the electrodes $3a, 3b \ldots 3n$ used as the integration electrodes during the integration period. That is, when the voltages $V_1, V_2$ and $V_0$ ($V_0 < V_1 < V_2$) are applied to the electrode conductors $\phi_1, \phi_2$ and $\phi_3$, respectively (see FIG. 1-B), such a potential distribution as is indicated by a numeral 10 of FIG. 1-B is obtained with the result that the integrated electrons $9a, 9b \ldots 9n$ start to be shifted to the potential wells produced below the electrodes $4a, 4b \ldots 4n$ as shown by arrows. When the voltage $V_0$ is applied to the electrode conductors $\phi_1$ and $\phi_3$ and the voltage $V_2$ to the electrode conductor $\phi_2$ (see FIG. 1-C) after the substantial completion of electron shifting, transference of the electrons $9a, 9b \ldots 9n$ to the potential wells $11a, 11b \ldots 11n$ is completed. By repeatedly effecting such transference the information carriers are guided to the transfer device end and read out. That is, through applying a voltage having such a waveform as is shown in, for example, FIG. 2 to the electrode conductors $\phi_1, \phi_2$ and $\phi_3$ during the transfer and readout period $T_3$ the integrated electrons $9a, 9b \ldots 9n$ are sequentially drawn out as a video signal from the output terminal 16 by readout means including, for example, a diode 13 consisting of an $N^+$ region and an electrode 12, DC source 14 and output resistor 15. A reference numeral 18 denotes an amplifier. The video signal from the output terminal 16 is reproduced in image display means in the same manner as in the case of a prior art television camera.

Generally, in order to make a displayed image easy to see, the image is subjected to contrast adjustment by controlling the gain of an amplifier within the image pickup apparatus and to brightness adjustment by varying the black level of the image. When, in the above case, however, the whole or part of a foreground subject presents a variation in brightness, the displayed image or monitored image becomes hard to see. In such a case, an automatic light sensitivity adjustment system wherein a target voltage is adjusted in accordance with a vidicon output signal level as in the case of a television camera using a vidicon tube can not be applied to the CCD.

Accordingly, as the control means for automatically controlling the light sensitivity of the charge transfer device there is known control means for controlling said light sensitivity through adjusting the amount of light incident into the semiconductor substrate of the device by an iris diaphragm. Further, there is also known control means for controlling the light sensitivity through incorporating in the CCD itself an automatic light sensitivity adjustment mechanism for comparing the output signal level of the CCD with a predetermined reference level and equalizing the output level of the CCD to the reference level even where the intensity of said incident light is varied. In the latter control means, the output signal varied in accordance with the intensity of the incident light is fed back to said automatic light sensitivity adjustment mechanism. Said feedback signal is an average output signal of all outputs of the CCD, or an average output signal of the outputs of the CCD corresponding to the central part of the monitored image since the foreground subject is generally positioned on the central part of the monitored image, or a signal indicating the peak value of a low frequency component filtered from the outputs of the CCD.

Where it is desired to incorporate the automatic light sensitivity adjustment mechanism in the charge transfer apparatus, the integration period $T_2$ shown in FIG. 2 is required to be varied in accordance with the intensity of light received. However, if the number of images reproduced by a video signal readout from the CCD for every unit time (generally, scanning of 30 frames/sec. or 60 fields/sec. is performed) and the frequency of effecting the charge transferring and reading-out are respectively determined, the respective lengths of the periods $T_1$ and $T_3$ of FIG. 2 will be determined, so that the length of the integration period $T_2$ is fixed. Accordingly, where it is desired to vary the period $T_2$, it becomes necessary to vary the number of frames per unit time in accordance with the intensity of light received, or to vary the transferring and reading out frequency in accordance with the intensity of light received. This, however, renders the image reproduction difficult.

Accordingly, the object of the invention is to provide a charge transfer apparatus capable of controlling the effective integration period for the carrier integration in accordance with the intensity of light received.

The charge transfer apparatus of the invention comprises at least one charge transfer device wherein a plurality of electrodes are provided on a semiconductor substrate in a manner insulated therefrom, means for supplying a driving pulse waveform of a constant period covering an integration period and a transfer-readout period to each of said electrodes of said charge transfer device, detecting means for detecting the amount of light incident into said charge transfer device or the level of output signal of the charge transfer device, and means for controlling the width of an integration pulse within the integration period in accordance with the signal detected by the detecting means.

The charge transfer device is so constructed that the respective lengths of one cycle, i.e., one frame period and the transfer-readout period are so fixed that a good light sensitivity adjustment can be made by adjusting the width of an integration pulse within the fixed integration period. The width of said integration pulse is the width of an integration pulse adjacent the point of time at which transference is started, and said integration pulse width is controlled in accordance with the brightness of a foreground subject. That is to say, what is referred to as the "integration pulse" here in this specification is that pulse within the integration period which so acts as to integrate the charge being transferred by the transfer pulse immediately succeeding the integration period. Control of said integration pulse width is performed in accordance with the output value obtained by integrating for a prescribed length of period the output signal of the charge transfer device or the output signal photoelectrically converted from the light incident into the charge transfer device. Said integration pulse is applied to the integration electrodes within the integration period. In the foregoing manner, the automatic light sensitivity adjustment can be carried out.

This invention can be more fully understood from the following detailed description when taken in conjunction with the accompanying drawings, in which:

FIG. 1-A, FIG. 1-B and FIG. 1-C are enlarged views respectively illustrating the principle of the charge integrating, transferring and reading-out operations of a prior art CCD by its fundamental construction;

FIG. 2-A, FIG. 2-B and FIG. 2-C respectively illustrate the prior art waveform of a voltage for driving the CCD of FIG. 1;

FIG. 3-A, FIG. 3-B and FIG. 3-C respectively illustrate the waveform of a driving voltage for use in a charge transfer apparatus of the present invention;

FIG. 4-A, FIG. 4-B and FIG. 4-C respectively illustrate the waveform of a driving voltage for obtaining the waveforms illustrated in FIG. 3;

FIG. 6-A and FIG. 6-B respectively illustrate a modification of the waveform illustrated in FIG. 3;

FIG. 7-A and FIG. 7-B respectively illustrate another modification of the waveform illustrated in FIG. 3.

Figure 3:
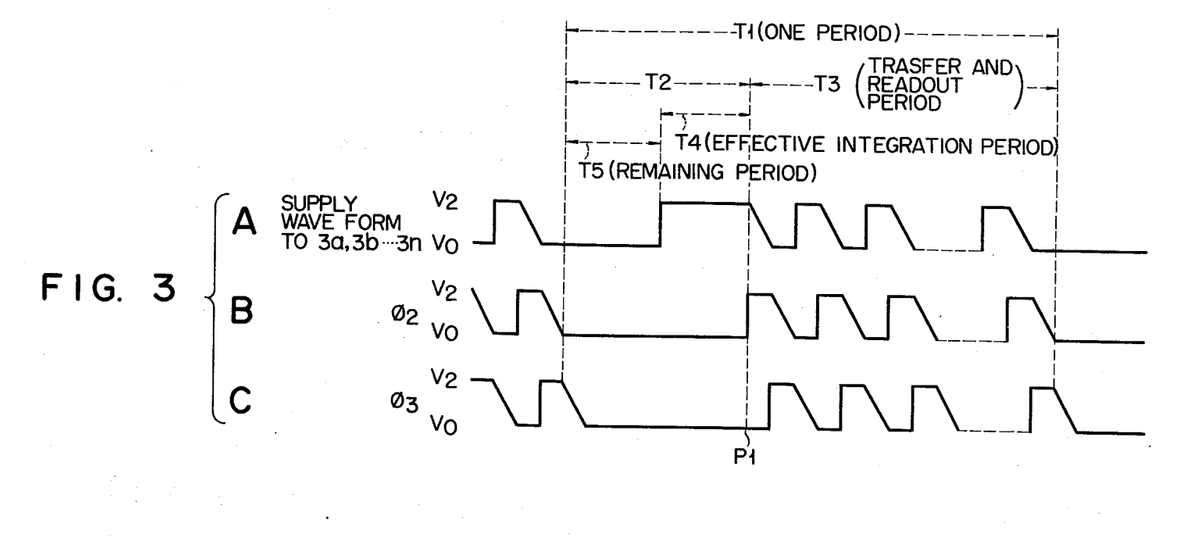
Figure 5:
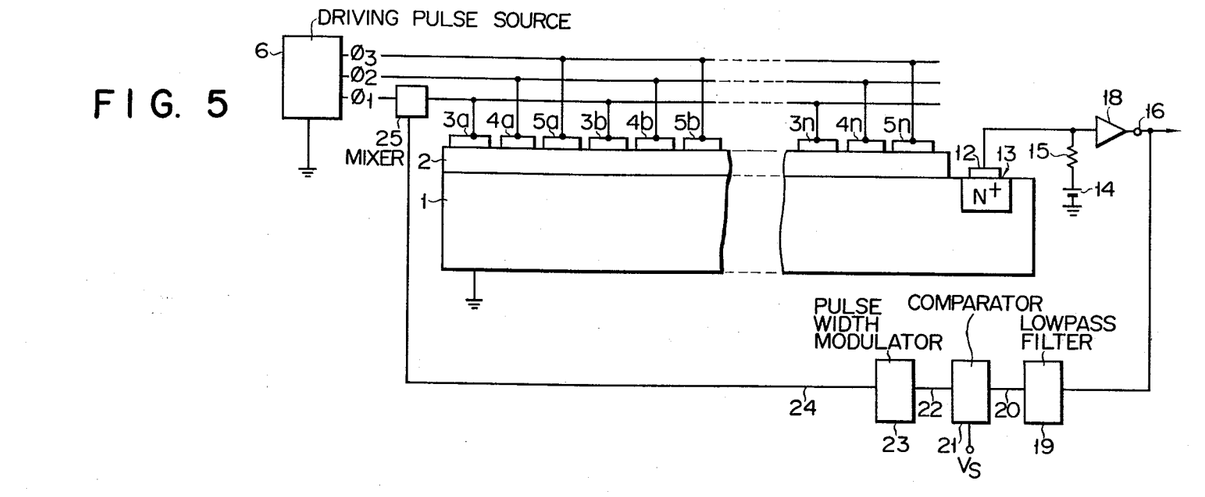
FIG. 5 is an enlarged view illustrating the construction of a first embodiment of the present invention.

A charge transfer apparatus illustrated in FIG. 5 is one provided with means for varying the waveform of a voltage applied to the electrode conductor $\phi_1$ illustrated in FIG. 1 in accordance with the intensity of light received. Accordingly, the same parts and sections as those of FIG. 1 are denoted by the same reference numerals, and description thereof is omitted. Where electrodes ($3a$, $3b$ ... $3n$) of FIG. 5 are used as the integration electrodes, the voltage wavefroms as illustrated in FIG. 3-B and FIG. 3-C are applied to the electrode conductors $\phi_2$ and $\phi_3$, but the voltage of a waveform as illustrated in FIG. 3-A is applied to the integration electrodes ($3a$, $3b$ ... $3n$) through the electrode conductor $\phi_1$ and a mixer 25. The integration electrodes are ones impressed with an integration pulse, and a group of electrodes ($4a$, $4b$ ... $4n$) or a group of electrodes ($5a$, $5b$ ... $5n$) may be used as the integration elelctrode group each time one field or one frame is renewed. FIG. 3-A, FIG. 3-B and FIG. 3-C respectively illustrate the waveform of a driving voltage applied to the respective electrode groups, one period of said waveform covering the integration period $T_2$ and the transfer-readout period $T_3$. During one frame period $T_1$, the integration period $T_2$ and the transfer-readout period $T_3$, respectively, a repetition pulse whose waveform is kept constant is applied to the respective electrode groups. However, that voltage waveform (FIG. 3-A) to be impressed upon the integration electrodes $3a$, $3b$ ... $3n$ during the fixed integration period $T_2$ is divided into two parts, namely the waveform of an effective integration period (during which the integration pulse is applied) $T_4$ and that of the remaining period $T_5$. Sometimes, the effective integration period $T_4$ may be reduced to zero. The effective integration period $T_4$ should be adjacent the point $P_1$ of transference starting time of the transfer-readout period $T_3$. That is, the period $T_4$ is the width or period of a pulse for producing the potential well in which charges being transferred is integrated. The length of the integration period $T_4$ is varied by a later-described means. In this embodiment, an integration voltage is not applied to the integration electrodes during the remaining period $T_5$. Such means is given by a charge transfer apparatus illustrated in, for example, FIG. 5.

Figure 4:
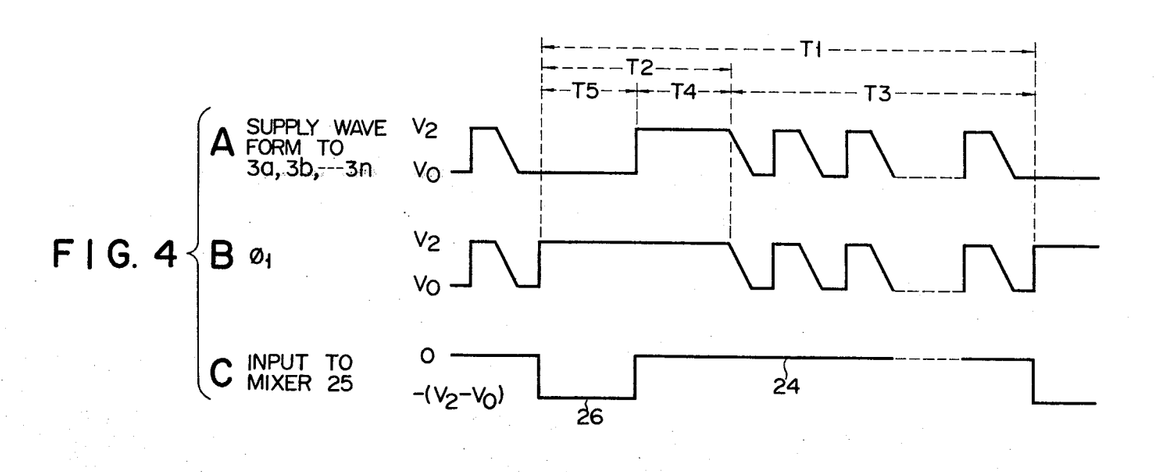

Referring to FIG. 5, the output end 16 of readout means (including a diode 13 in this embodiment) is connected to a low pass filter 19. The low pass filter 19 has a time constant of, for example, 2 to 3 seconds. By the low pass filter 19 the DC component voltage or low frequency component voltage 20 of the output signal of the CCD is supplied to a comparator 21 and compared there with a voltage having a predetermined reference level Vs, and the voltage difference 22 between the input voltage 20 and the voltage having the reference level is supplied to a pulse width modulator 23. The pulse width modulator (which is hereinafter abbreviated to PWM) is varied in the output pulse width in accordance with the magnitude of said voltage difference. A monomultivibrator circuit, for example, can be used as the pulse width modulator. The output waveform 24 of the PWM is supplied to the previously mentioned mixer 25 connected in series to the electrode conductor $\phi_1$ and mixed with a voltage supplied from a voltage source 6 to the electrode conductor $\phi_1$. That is, the voltage supplied to the electrode conductor $\phi_1$ from the voltage source 6 has a level of $V_2$ during the period $T_2$ as shown in FIG. 2-A or FIG. 4-B. However, the output waveform 24 from the PWM is one whose reference level is $O_V$ and which includes a pulse 26 having a level of $-(V_2-V_0)$, as illustrated in FIG. 4-C. Accordingly, it is apparent that the waveform of FIG. 4-A is obtained by mixing the waveform of FIG. 4-B with that of FIG. 4-C. Though, actually, the optical image of a foreground subject is focussed on the semiconductor substrate via an optical lens, the optical lens is not illustrated. The width of the pulse 26 is varied in accordance with the output of the CCD, i.e., the brightness of a foreground subject. Accordingly, by controlling the width of the pulse 26 the length of the effective integration period T4 is also varied in accordance with the brightness of a foreground subject. That is, the light sensitivity of the CCD is controlled in accordance with the brightness of a foreground subject.

Figure 6:
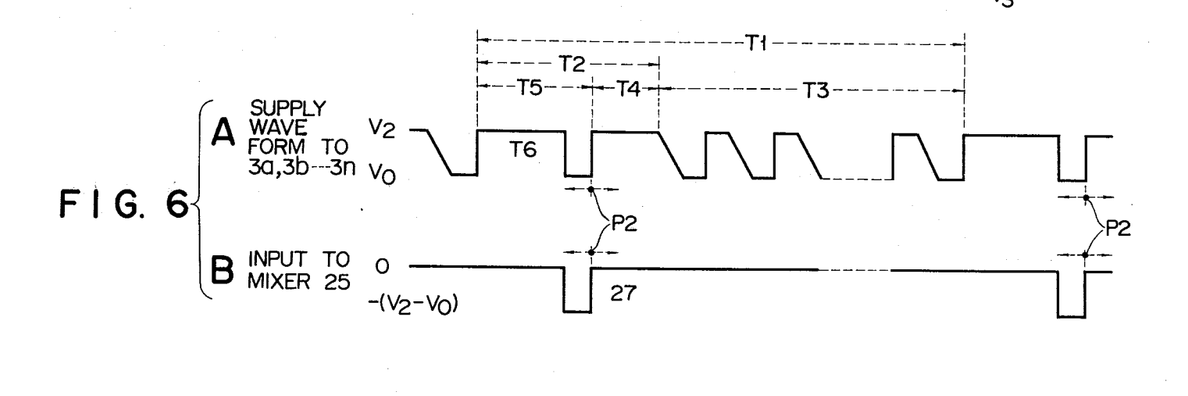

FIG. 6 illustrates the respective modifications of waveforms for controlling the integration pulse width. To obtain these waveforms, a prior art pulse phase modulation circuit (which is hereinafter abbreviated to PPM) is used in replacement of the PWM 23 of FIG. 5. The PPM, as illustrated in FIG. 6-B, generates a voltage having the waveform whose base is $O_V$ and which includes a pulse 27 of prescribed width having a level of $-(V_2-V_0)$, and varies the position of the rising point P2 of the pulse 27, that is, the phase of the pulse 27 at the rising point $P_2$ in accordance with the magnitude of the voltage difference 22 (FIG. 5). In this manner, by adjusting the point of time at which the pulse 27 is generated, the effective integration period $T_4$ (FIG. 6-A) is varied in accordance with the brightness of a foreground subject. In this case, during that portion $T_6$ of the remaining period $T_5$ in which a voltage having a level of $V_2$ is applied to the integration electrodes, potential wells are produced in the semiconductor substrate and integrated with charges. Since, however, the period of a voltage level $V_0$ (the width of the negative charges integrated during the period $T_6$ is diffused from said potential wells into the semiconductor substrate during the period $(T_5-T_6)$, so that the pulse voltage within the period $T_6$ does not become an effective integration period. In the transfer-readout period $T_3$ immediately succeeding the period $T_4$, however, the transfer operation is carried out. Accordingly, only the pulse during the period $T_4$ serves as an effective pulse for integration of charges being transferred. This effective pulse is referred to as the "integration pulse" here in this specification.

Figure 7:
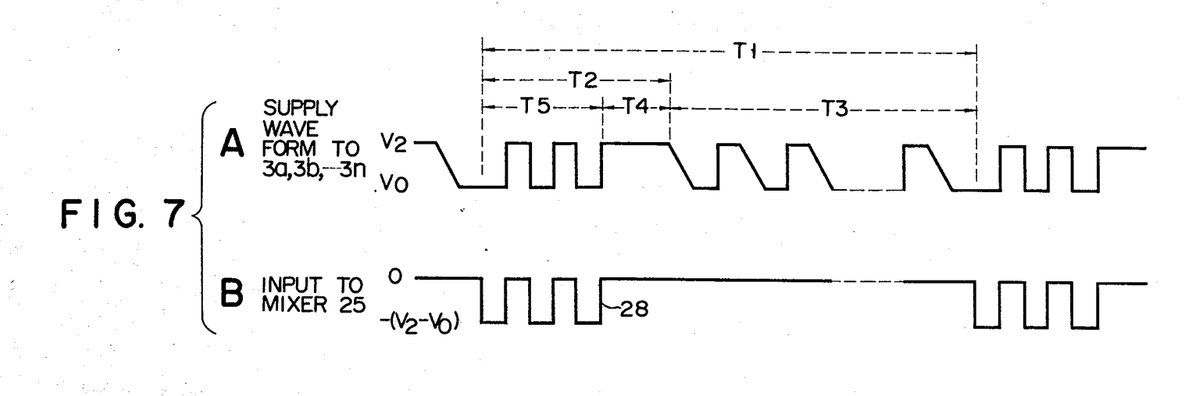

FIG. 7-A and FIG. 7-B respectively illustrate another modification of a waveform for obtaining the integration pulse. These waveforms can be obtained by using a prior art pulse number modulation circuit (which is hereinafter abbreviated to as PNM) whose pulse number is varied in accordance with the magnitude of the voltage difference 22 from the comparator 21, in replacement of the PWM of FIG. 5. FIG. 7-B shows the case where the PNM generates three pulses 28 whose bases are $O_V$ and which have a level of $-(V_2-V_0)$. In this case, the voltage waveform (FIG. 4-B) applied to the electrode conductor $\phi_1$ is converted within the period $T_2$ into that illustrated in FIG. 7-A. In the case of FIG. 7-A, the length of the period $T_4$, i.e., the integration pulse width is controlled by the number of pulses 28. Also in the case of FIG. 7-A, the period of a voltage level $V_0$ in which the potential wells disappear immediately precedes the period $T_4$, as in the case of FIG. 6, so that the effective integration period is limited to the period $T_4$. That is, the integration pulse for integration of charges being transferred is the pulse applied during the period $T_4$.

Figure 8:
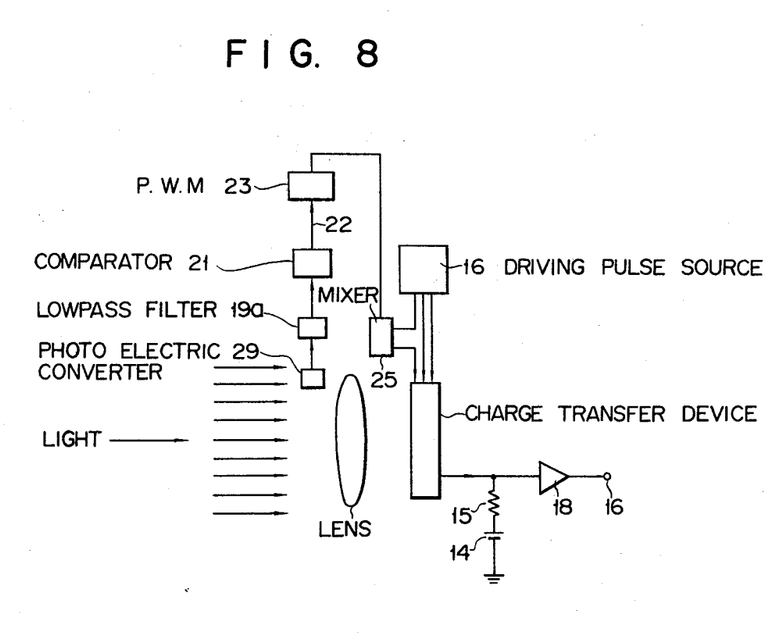
FIG. 8 is a block diagram illustrating the construction of a second embodiment of the invention.

FIG. 8 illustrates a second embodiment of the invention which is so constructed that the integration pulse width is controlled by detecting the light incident into the semiconductor substrate. The light irradiated onto the semiconductor substrate via a lens is received by a photoelectric converter 29, for example, a photo-transistor, and the output of the converter 29 as passed through a low pass filter 19a is compared with a reference voltage $V_s$ by a comparator 21. The PWM 23 is controlled by the output of the comparator 21, and the output of the PWM is supplied to a mixer 25. Control means for controlling the integration pulse width is the same as the second embodiment illustrated in FIG. 5.

This invention can be applied also to the Bucket Brigade Device. This invention is not limited to the channel type (P channel or N channel), driving system (single phase, two phase or three phase driving systems), and electrode arrangement (one dimensional or two dimensional arrangements) of the charge transfer device.

What is claimed is:

1. In a system for light sensitivity control of an image pickup device comprising a charge transfer device which comprises a plurality of electrodes provided on a semiconductor substrate in a manner insulated therefrom and means for controlling the light sensitivity of said image pickup device by controlling the width of an integrating pulse supplied from a driving voltage source to said electrodes within a constant integration period, the improvements wherein said charge transfer device further includes means for mixing a plurality of pulses with said driving voltage in the manner that said plurality of pulses are inserted within an insensitive period resulting from the integration pulse width control.

2. In a system according to claim 1, wherein said means for controlling said integration pulse width and for mixing said plurality of pulses comprises a comparator for comparing the output of said charge transfer device with the voltage of a reference level to obtain a difference output therebetween, a pulse number modulation circuit supplied with said difference output of said comparator to vary the number of its output pulses, and a mixer coupled between said driving voltage source and said electrodes and adapted to mix the output pulses of said pulse number modulation circuit with said driving voltage.

3. In a system according to claim 1, wherein said means for controlling said integration pulse width and for mixing said plurality of pulses comprises a photoelectric converter which converts the amount of light incident into said charge transfer device to a corresponding electrical signal, a comparator for comparing the level of said electrical signal with the voltage of a reference level to obtain a difference output therebetween, a pulse number modulation circuit supplied with said difference output of said comparator to vary the number of its output pulses, and a mixer coupled between said driving voltage source and said electrodes and adapted to mix the output pulses of said number modulation circuit with said driving voltage.

* * * * *